United States Patent
Yajima et al.

(10) Patent No.: US 6,982,211 B2
(45) Date of Patent: Jan. 3, 2006

(54) WATER JET PROCESSING METHOD

(75) Inventors: Koichi Yajima, Tokyo (JP); Satoshi Tateiwa, Tokyo (JP); Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 10/999,963

(22) Filed: Dec. 1, 2004

(65) Prior Publication Data

US 2005/0196940 A1    Sep. 8, 2005

(30) Foreign Application Priority Data

Dec. 2, 2003  (JP)  ............................. 2003-403292
Dec. 8, 2003  (JP)  ............................. 2003-408676

(51) Int. Cl.
*H01L 21/301* (2006.01)
(52) U.S. Cl. ...................... 438/460; 438/462; 438/464
(58) Field of Classification Search ................ 438/460, 438/462, 464
See application file for complete search history.

(56) References Cited

U.S. PATENT DOCUMENTS

| 6,676,485 | B1 * | 1/2004 | Quirke et al. ................ 451/38 |
| 2005/0126472 | A1 * | 6/2005 | Popescu et al. ............ 117/200 |
| 2005/0145166 | A1 * | 7/2005 | Seo et al. ................... 117/200 |
| 2005/0158967 | A1 * | 7/2005 | Huang et al. .............. 438/460 |

* cited by examiner

*Primary Examiner*—Trung Dang
(74) *Attorney, Agent, or Firm*—Smith, Gambrell & Russell, LLP

(57) ABSTRACT

A water jet processing method for cutting a workpiece having a first group composed of first plural cutting lines extending in a predetermined direction and a second group composed of second plural cutting lines formed perpendicular to the plural cutting lines of the first group along the plural cutting lines of the first group and the plural cutting lines of the second group formed on the workpiece by injecting a water jet, which comprises a first cutting step for injecting a water jet to the cutting lines of the first group continuously and a second cutting step for injecting a water jet to the cutting lines of the second group continuously while the workpiece is supported by a support member.

6 Claims, 13 Drawing Sheets

Fig. 3
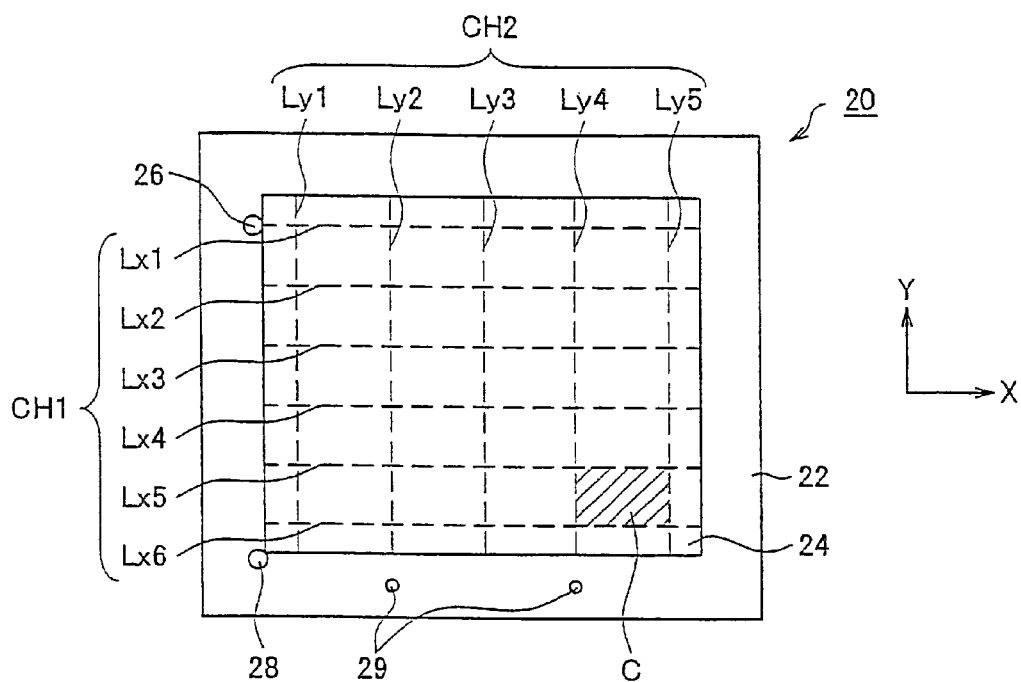
(a)
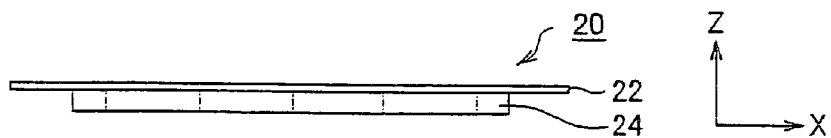
(b)

Fig. 4
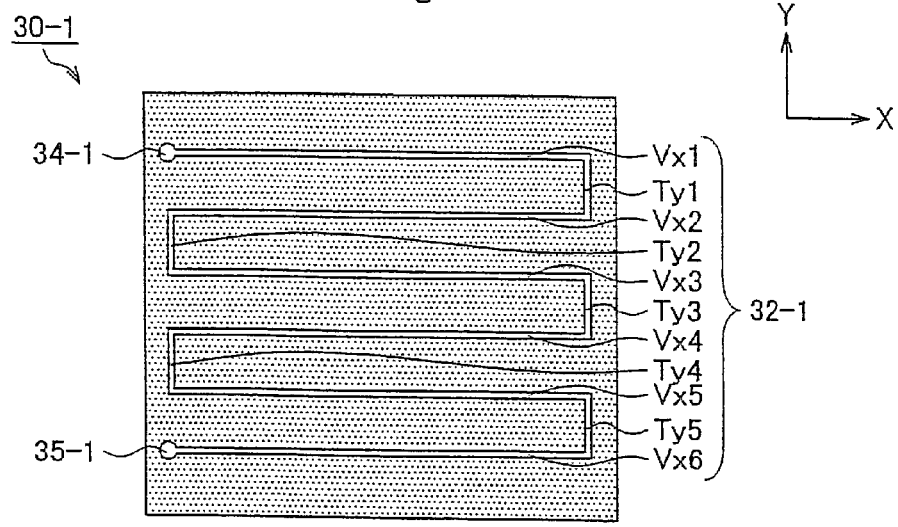
(a)
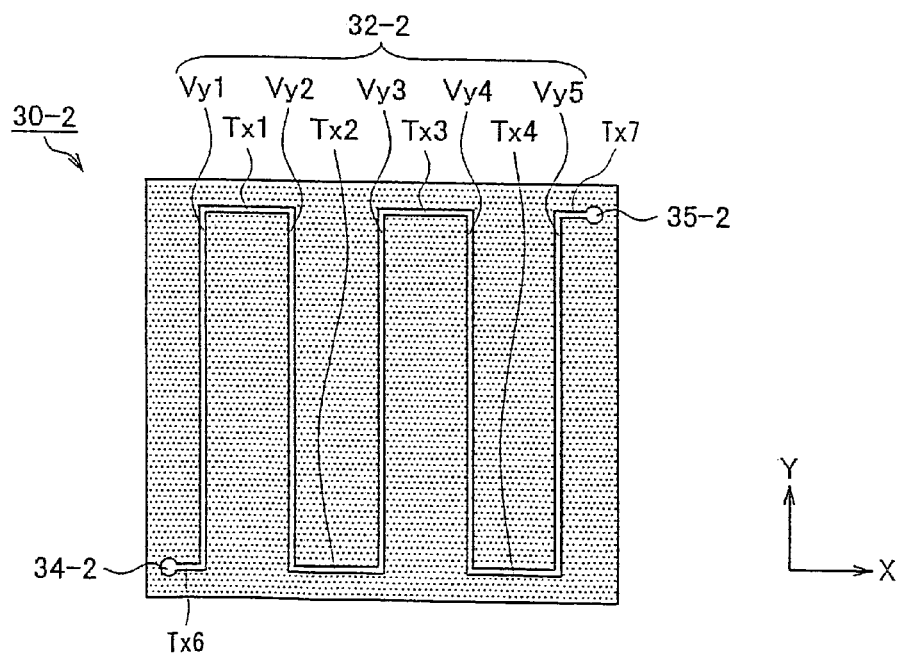
(b)

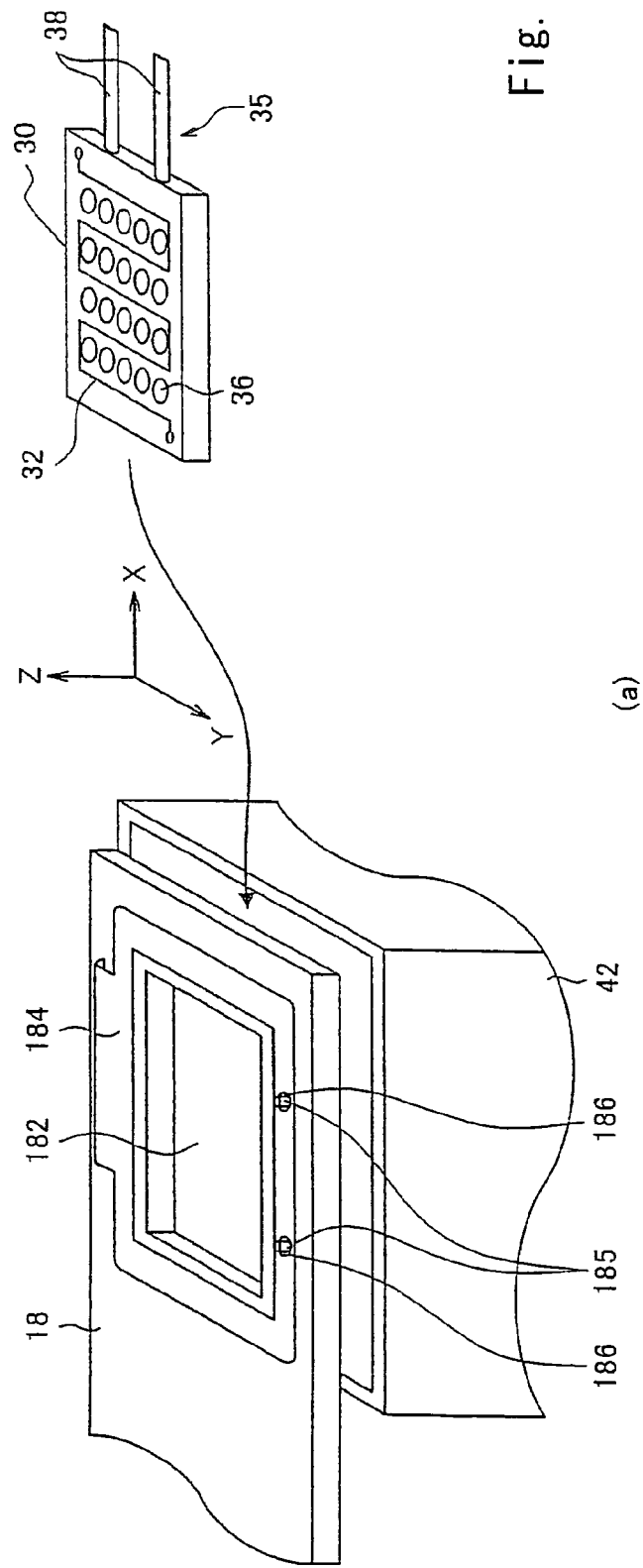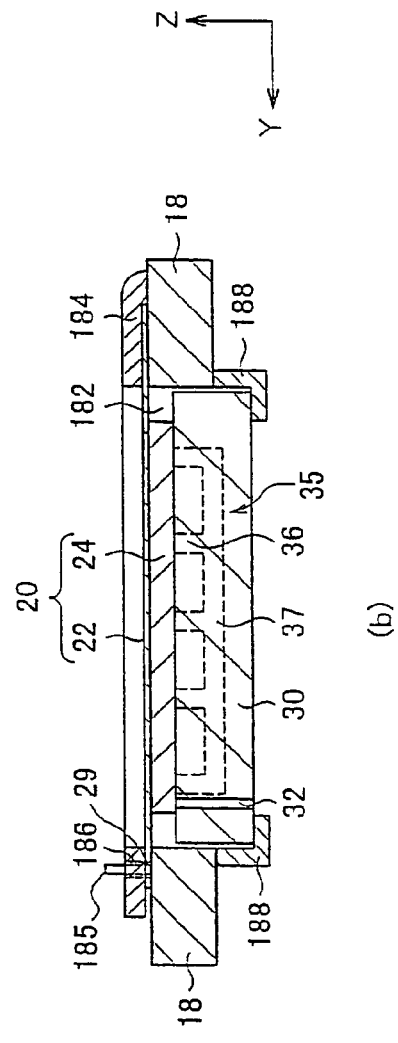
Fig. 5

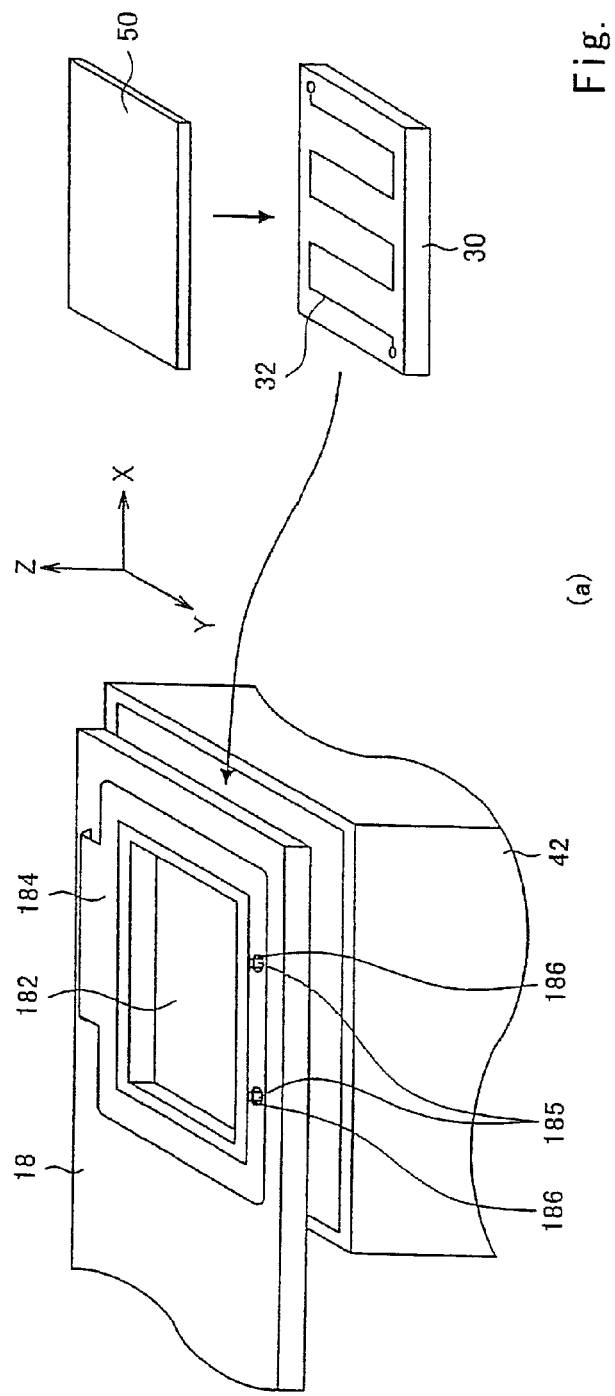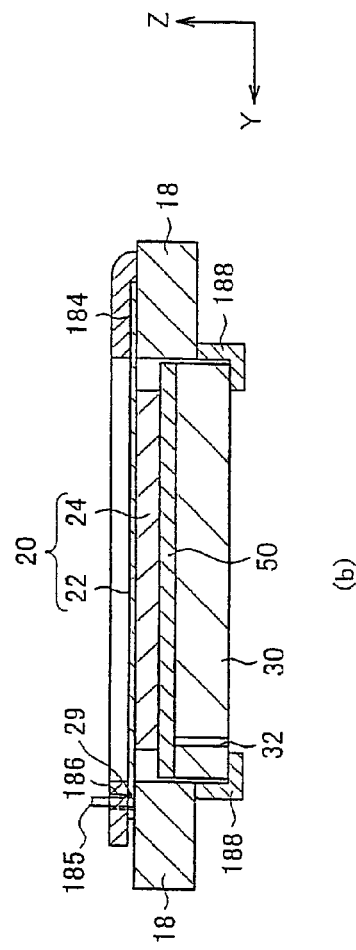
Fig. 6

Fig. 8
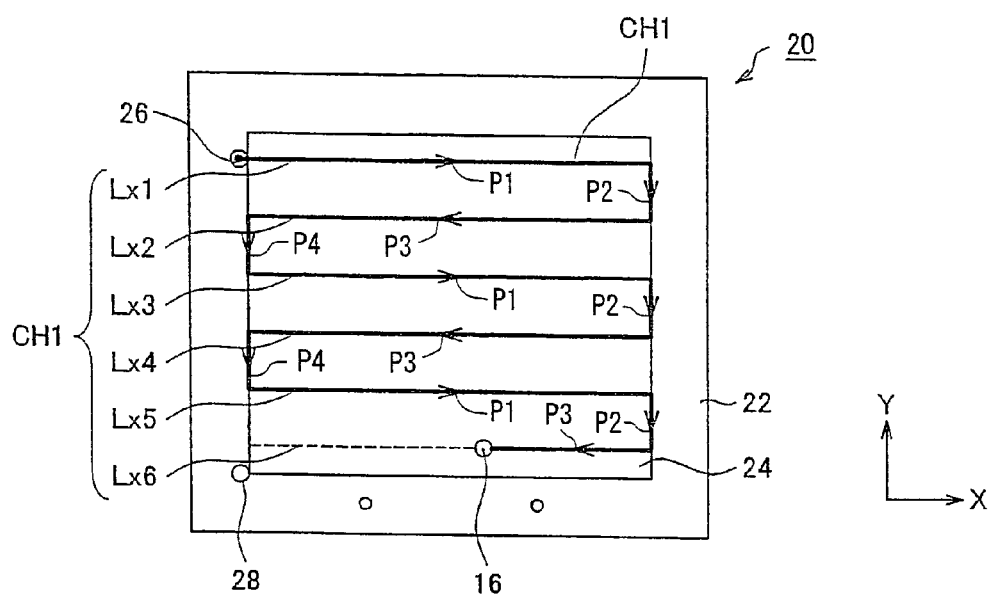
(a)
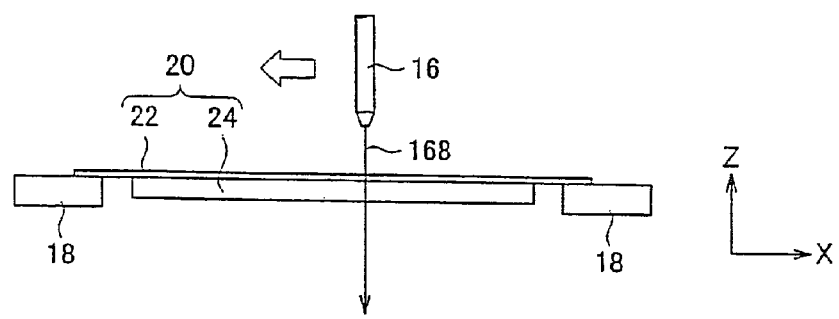
(b)

(a) (b)

WATER JET PROCESSING METHOD

FIELD OF THE INVENTION

The present invention relates to a water jet processing method for cutting a workpiece such as a semiconductor wafer or the like by injecting high-pressure processing water to the workpiece.

DESCRIPTION OF THE PRIOR ART

In the production process of a semiconductor device, a large number of rectangular areas are sectioned by cutting lines called "streets" formed in a lattice pattern on the surface of a semiconductor wafer, and a circuit such as IC, LSI or the like is formed in each of the large number of rectangular areas. Individual semiconductor chips are manufactured by dicing the semiconductor wafer having a large number of circuits thereon along the cutting lines. The thus divided semiconductor chips are packaged and widely used in electric appliances such as cellular phones, personal computers and the like.

Lighter and smaller electric appliances such as cellular phones and personal computers are now in demand, and packaging technologies called "Chip Size Package (CSP)" that can reduce the size of a semiconductor chip package, have already been developed. As one of the CSP technologies, a packaging technology called a "Quad Flat Non-lead Package (QFN)" has been implemented. In this packaging technology called QFN, a CSP substrate is manufactured by arranging a plurality of semiconductor chips in a matrix on a metal plate such as a copper plate, on which a plurality of connection terminals corresponding to the connection terminals of the semiconductor chips are formed and cutting lines for sectioning the semiconductor chips arranged in a lattice pattern are formed, and by integrating the metal plate with the semiconductor chips by means of a resin portion formed by molding a resin from the back surface side of the semiconductor chips. This CSP substrate is cut along the cutting lines to be divided into individual chip size packages (CSP).

The above CSP substrate is generally cut with a precision cutting machine called "dicing machine". This dicing machine comprises a cutting blade having an annular abrasive grain layer and cuts the CSP substrate along the cutting lines by moving this cutting blade relative to the CSP substrate along the cutting lines of the CSP substrate while rotating the cutting blade, thereby dividing it into individual chip size packages (CSP). When the CSP substrate is cut with the cutting blade, however, a problem arises that burrs are formed on the connection terminals to cause a short circuit between adjacent connection terminals, thereby reducing the quality and reliability of a chip size package (CSP).

Further, when not only the CSP substrate but a workpiece such as a semiconductor wafer or the like is cut with the cutting blade, a problem also occurs that fine chippings are adhered onto the surface of the workpiece with the result of contamination of the workpiece.

As a cutting technology for solving the above problems caused at the time of cutting with the cutting blade, for example, Japanese Laid-open Utility Model Application Hei 2-15300 and JP-A 2000-246696 disclose a water jet cutting technique for cutting a workpiece by injecting a jet of high-pressure water containing abrasive grains such as garnet, alumina or silicon carbide abrasive grains from a nozzle to the workpiece held by a workpiece holding means. This type of water jet cutting technique has advantages that it can cut the workpiece without exerting a thermal influence on the workpiece and that the formation of burrs can be suppressed. Also, a composite material and a material which is hard to cut can easily cut with the water jet cutting technique.

When a workpiece such as the above CSP substrate having a first group of plural cutting lines extending in a predetermined direction and a second group of plural cutting lines formed perpendicular to the first group of plural cutting lines is to be cut along the plural cutting lines of the first group and the plural cutting lines of the second group, however, it is substantially difficult to repeat the injection and suspension of a water jet for each of cutting lines. That is, a water jet processing machine injects a jet of high-pressure water generated by using a high-pressure water generating means comprising a booster. When the operation of the high-pressure water generating means is suspended each time the terminal of each cutting line is reached, it takes time to resume the operation of the high-pressure water generating means, thereby greatly reducing productivity. Therefore, to improve productivity, it is desired that the workpiece should be cut along a plurality of cutting lines continuously without suspending the high-pressure water generating means.

SUMMARY OF THE INVENTION

It is an object of the present invention to provide a water jet processing method capable of cutting a workpiece along a plurality of cutting lines continuously without suspending a high-pressure water generating means.

According to the present invention, the above object can be attained by a water jet processing method for cutting a workpiece having a plurality of first cutting lines extending in a predetermined direction and a plurality of second cutting lines formed perpendicular to the plurality of first cutting lines by injecting a water jet along the plurality of first cutting lines and the plurality of second cutting lines formed on the workpiece, the method comprising the steps of:

a first cutting step for repeating a first step for moving the water jet and the workpiece relative to each other from one end to the other end of a first cutting line of the first group formed on one side of the first group of cutting lines formed on the workpiece while the water jet is applied along the first cutting line, a second step for moving the water jet and the workpiece relative to each other from the other end of the first cutting line to the other end of a second cutting line of the first group adjacent to the first cutting line, a third group for moving the water jet and the workpiece relative to each other from the other end to one end of the second cutting line, and a fourth step for moving the water jet and the workpiece relative to each other from one end of the second cutting line to one end of a third cutting line of the first group adjacent to the second cutting line, up to the last cutting line of the first group formed on the other side of the first group of cutting lines formed on the workpiece; and a second cutting step for repeating a first step for moving the water jet and the workpiece relative to each other from one end to the other end of a first cutting line of the second group formed on one side of the second group of cutting lines formed on the workpiece while the workpiece which has undergone the first cutting step is supported by a support member having through-grooves corresponding to the cutting lines of the second group and the water jet is applied along the first cutting line, a second step for moving the water jet and the workpiece relative to each other from the other end of the first cutting line to the other end of a second cutting line of the second group adjacent to the first cutting line, a third group for moving the water jet and the workpiece relative to each other from the other end to one end of the second cutting line, and a fourth step for moving the water jet and the workpiece relative to each other from one end of the second cutting line to one end of a third cutting line of the second group adjacent to the second cutting line, up to the last cutting line of the second group formed on the other side of the second group of cutting lines.

Preferably, the first cutting step is carried out by supporting the workpiece by a holding member having through-grooves corresponding to the cutting lines of the first group formed on the workpiece.

The support member for supporting the workpiece in the second cutting step has a plurality of suction holes which are open at positions corresponding to a plurality of areas sectioned by the plural cutting lines of the first group and the plural cutting lines of the second group of the workpiece, and suction passages communicating with the plurality of suction holes, and suction-holds the workpiece. The support member for supporting the workpiece in the second cutting step holds the workpiece by means of an adhesive tape. It is desired that the adhesive tape has a property that its adhesion strength is reduced by an external stimulus.

The relative moving speed of the water jet and the workpiece in the second step and the fourth step of the first cutting step is set faster than the relative moving speed of the water jet and the workpiece in the first step and the third step so that the workpiece is not cut through.

In the present invention, as the workpiece is cut continuously along the cutting lines of the first group extending in a predetermined direction formed on the workpiece in the first cutting step and along the cutting lines that are formed perpendicular to the first group, of the second group in the second cutting step, the workpiece can be cut along the plural cutting lines formed in a lattice pattern only by suspending the high-pressure water generating means at the end of the first cutting step, thereby making it possible to improve productivity.

BRIEF DESCRIPTION OF THE DRAWINGS

FIGS. 3(a) and 3(b) are a plan view and a front view of a CSP substrate as a workpiece;

FIGS. 4(a) and 4(b) are plan views of a first support member and a second support member for supporting the CSP substrate shown in FIGS. 3(a) and 3(b);

FIG. 5(a) is a perspective view of an embodiment of a holding table and a support member and FIG. 5(b) is a sectional view showing a state where the support member is set in the holding table;

FIG. 6(a) is a perspective view of another embodiment of a holding table and a support member and FIG. 6(b) is a sectional view showing a state where the support member is set in the holding table;

FIGS. 8(a) and 8(b) are explanatory diagrams showing a first cutting step in the water jet processing method according to a first embodiment of the present invention;

DETAILED DESCRIPTION OF THE PREFERRED EMBODIMENTS

Preferred embodiments of a water jet-processing machine according to the present invention will be described in detail here in under with reference to the accompanying drawings.

Figure 1:
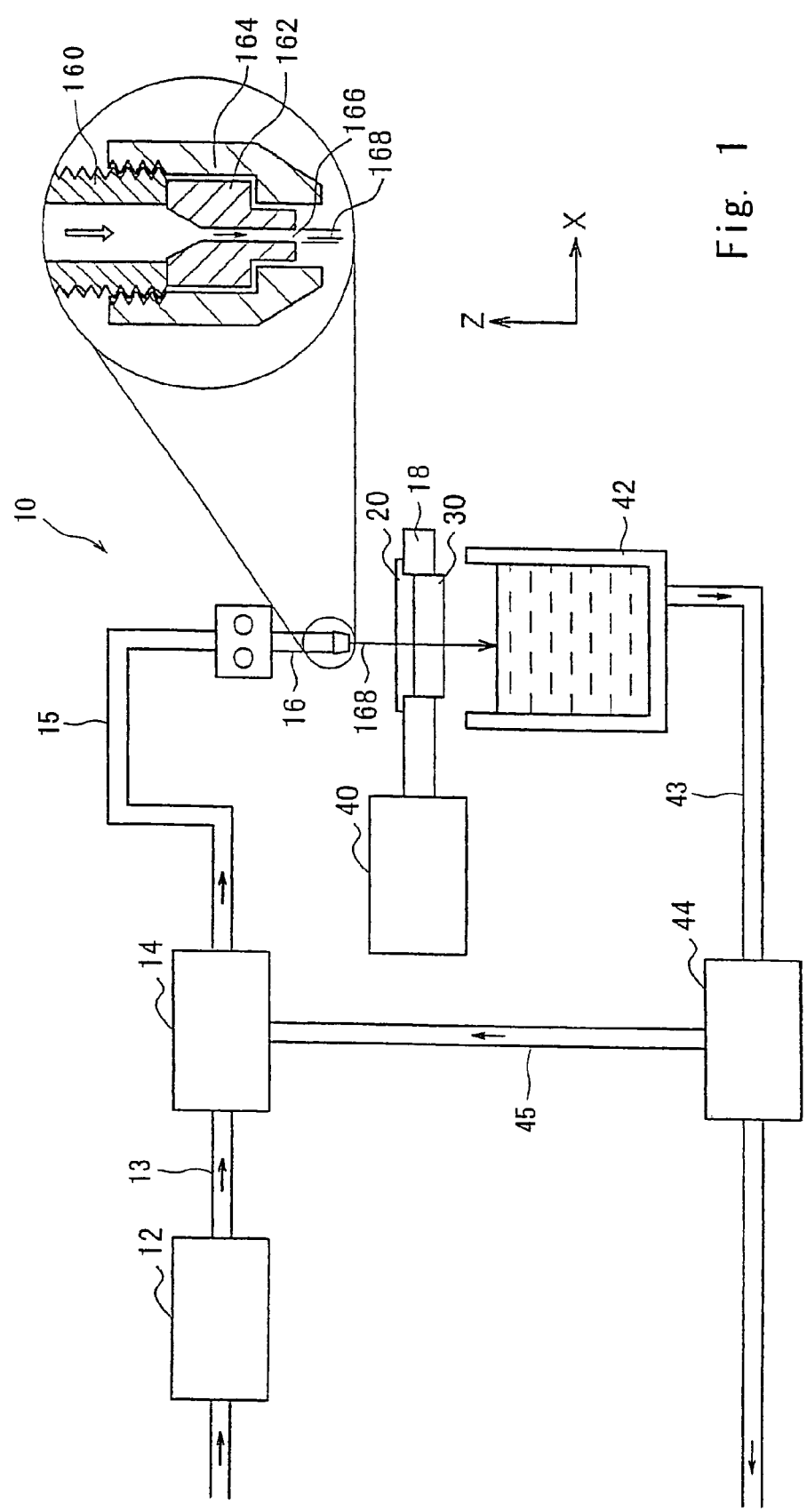
FIG. 1 is a schematic diagram showing the constitution of a water jet processing machine for carrying out the water jet processing method of the present invention.

FIG. 1 is a schematic diagram showing the constitution of a water jet processing machine for carrying out the water jet processing method of the present invention.

The water jet processing machine 10 shown in FIG. 1 comprises a high-pressure water generating means 12, an abrasive grain mixing means 14, an injection nozzle 16, a holding table 18, a support member 30, a table moving means 40, a catch tank 42 and an abrasive grain collecting means 44.

The high-pressure water generating means 12 is composed of a booster or the like and pressurizes water supplied from the outside to generate high-pressure water having a pressure of, for example, 600 to 700 bar. High-pressure water generated by this high-pressure water generating means 12 is supplied to the abrasive grain mixing means 14 through a high-pressure pipe 13.

The abrasive grain mixing means 14 mixes abrasive grains with high-pressure water supplied from the high-pressure water generating means 12, in a predetermined ratio. The abrasive grains are powders or grains having a particle diameter of several tens of $\mu$m and made of a material with a high hardness, such as garnet, diamond, alumina or the like. The high-pressure water which has been mixed with the abrasive grains by the abrasive grain mixing means 14 is supplied to the injection nozzle 16 through a high-pressure pipe 15.

Describing the above abrasive grain mixing means 14 specifically, the abrasive grain mixing means 14 comprises two mixing-storage tanks (not shown) and a tank changeover means (not shown), for example. In the mixing-storage tanks, high-pressure water supplied from the above high-pressure water generating means 14 and abrasive grains supplied from the abrasive grain collecting means 44 that will be described later are mixed together and stored. The tank changeover means is composed of a changeover valve, etc. for connecting one of the two mixing-storage tanks to the high-pressure water generating means 12 and the injection nozzle 16.

The abrasive grain mixing means 14 thus constituted pushes out abrasive grains and water, which are stored in one of the mixing-storage tanks, by the pressure of high-pressure water supplied from the high-pressure water generating means 12 at a high pressure to supply them to the injection nozzle 16, and stores abrasive grains and water collected by the abrasive grain collecting means 44 in the other mixing-storage tank. When the abrasive grains and water stored in one of the mixing-storage tanks are reduced to a predetermined level or lower, changeover between the mixing-storage tanks is effected by the above tank changeover means so that the one mixing-storage tank is connected to the abrasive grain collecting means 44 and the other mixing-storage tank is connected to the high-pressure water generating means 12 and the injection nozzle 16. The high-pressure water containing abrasive grains can be supplied to the injection nozzle 16 continuously and stably by suitably carrying out switching between the two mixing-storage tanks as described above.

The above injection nozzle 16 sprays high-pressure water containing abrasive grains supplied from the abrasive grain mixing means 14 to the CSP substrate 20 as a workpiece from above at a high velocity. The injection nozzle 16 is fixed to the base (not shown) of the machine by a suitable fixing means. The injection nozzle 16 is constituted to be allowed to move in the direction indicated by an arrow Z in FIG. 1 so that the interval between it and the workpiece can be adjusted according to the type and thickness of the workpiece. This injection nozzle 16 has an orifice 162 mounted onto the end of a body 160 as shown in the enlarged view of FIG. 1. The orifice 162 is mounted by screwing an orifice cover 164 into the end of the body 160. The velocity of a water jet 168 injected from the injection nozzle 16 thus constituted is 2 to 3 times faster than the velocity of sound. The interval between the end of the injection nozzle 16 and the CSP substrate 20 as a workpiece is set to, for example, 50 $\mu$m to 1 mm. By reducing the interval between the end of the injection nozzle 16 and the substrate 20, the diffusion of the water jet 168 can be suppressed as much as possible and also the spread of the cutting width can be prevented. Therefore, the diameter of the squirt hole 166 of the orifice 162 of the injection nozzle 16 is set to, for example, 250 $\mu$m.

Figure 2:
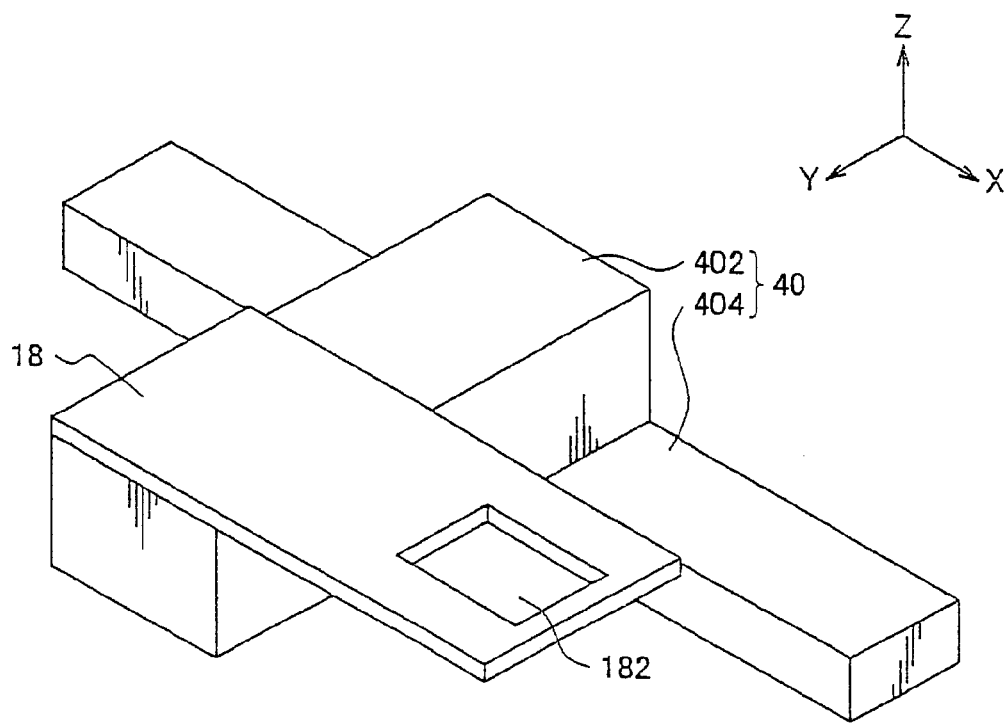
FIG. 2 is a perspective view of a holding table and a table moving means provided in the water jet processing machine shown in FIG. 1.

The above holding table 18 is composed of a plate made of a metal such as stainless steel or the like, and functions as a workpiece holding means for holding the CSP substrate 20 that is the workpiece. As shown in FIG. 2, an opening 182 for letting a water jet passes therethrough is formed in a portion for holding the CSP substrate 20 of this holding table 18. This opening 182 has a shape (for example, rectangular shape) corresponding to the shape of the CSP substrate 20 as the workpiece and is smaller than the outer size of the CSP substrate 20.

The above support member 30 is installed in the opening 182 of the holding table 18 to support the CSP substrate 20 from below. A detailed description of the support member 30 will be given later.

The above table moving means 40 consists of a Y axis moving means 402 for moving the holding table 18 in the direction indicated by an arrow Y and an X axis moving means 404 for moving the holding table 18 in the direction indicated by an arrow X. The Y axis moving means 402 and the X axis moving means 404 are each constituted by a drive mechanism such as an electric motor (not shown) and a gear mechanism or the like. The Y axis moving means 402 supports the above holding table 18 and moves it in the direction indicated by the arrow Y. The X axis moving means 404 supports the Y axis moving means 402 and moves the holding table 18 in the direction indicated by the arrow X, together with the Y axis moving means 402. By moving the holding table 18 in the directions indicated by the arrow Y and the arrow X by means of the Y axis moving means 402 and the X axis moving means 404, respectively, the CSP substrate 20 as the workpiece held on the holding table 18 can be moved relative to the injection nozzle 16 in the directions indicated by the arrow Y and the arrow X. The moving speed of the above holding table 18 is suitably set according to the material and thickness of the workpiece.

The above catch tank 42 is arranged below the holding table 18 and is open at the top. This catch tank 42 stores water containing abrasive grains up to a predetermined height, and the supply and discharge of water are so controlled as to maintain the surface of water at a predetermined level. Water stored in the catch tank 42 has the function of buffering the water jet 168 containing abrasive grains, which has been injected from the above injection nozzle 16 to cut through the CSP substrate 20 as the workpiece.

The above abrasive grain collecting means 44 collects abrasive grains from water containing abrasive grains discharged from the catch tank 42. This abrasive grain collecting means 44 is installed in an exhaust pipe 43 to collect abrasive grains having a particle diameter of, for example, 40 to 120 $\mu$m and return the collected abrasive grains to the mixing-storage tanks of the above abrasive grain mixing means 14 through a collection pipe 45.

A description will be subsequently given of the CSP substrate 20 as the workpiece with reference to a Quad Flat Non-lead Package (QFN) shown in FIGS. 3(*a*) and 3(*b*).

The CSP substrate 20 shown in FIGS. 3(*a*) and 3(*b*) comprises a rectangular metal frame 22 and a package portion 24 protruding from one side of the metal frame 22. A plurality of semiconductor devices arranged regularly are molded in the package portion 24 by a resin, and the outer size of the package portion 24 is smaller than the outer size of the metal frame 22. To divide the CSP substrate 20 thus constituted into individual chip size packages (CSP) C, a first group CH1 composed of first plural cutting lines Lx1 to Lx6 extending in a predetermined direction (horizontal direction in FIG. 3(*a*)) and a second group CH2 composed of second plural cutting lines Ly1 to Ly5 extending in a direction (vertical direction in FIG. 3(*a*)) perpendicular to the predetermined direction are formed on the surface of the metal frame 22.

In the CSP substrate 20 constituted as described above, a first cutting start hole 26 is formed at one end (left end in FIG. 3(*a*)) of a first cutting line Lx1 of the first group on one side (upper side in FIG. 3(*a*)) of the first group CH1, and a second cutting start hole 28 is formed at a left portion a little away from one end (left end in FIG. 3(*a*)) of a first cutting line Ly1 of the second group on one side (left side in FIG. 3(*a*)) of the second group CH2. The diameters of the first cutting start hole 26 and the second cutting start hole 28 are larger than the diameter of the water jet 168 to be injected from the above injection nozzle 16. Further, two positioning holes 29 and 29 to be fitted to positioning pins later described, which are provided on the above holding table 18, are formed in the CSP substrate 20.

A description will be subsequently given of the above support member 30 with reference to FIGS. 4(*a*) and 4(*b*).

FIG. 4(*a*) shows a first support member 30-1 and FIG. 4(*b*) shows a second support member 30-2. The first support member 30-1 and the second support member 30-2 are made of a metal such as aluminum or the like, formed as large as the package portion 24 of the above CSP substrate 20 and selectively set on the above holding table 18.

As shown in FIG. 4(a), first continuous through-grooves 32-1 consisting of through-grooves Vx1 to Vx6 corresponding to the cutting lines Lx1 to Lx6 of the first group formed on the above CSP substrate 20 and through-grooves Ty1 to Ty5 for connecting adjacent through-grooves Vx1 to Vx6 alternately at both ends of the through-grooves Vx1 to Vx6 are formed in the first support member 30-1. Describing the first through-grooves 32-1 in more detail, the through-grooves Vx1 and Vx2 are connected to each other by the through-groove Ty1 at the other ends (right ends in FIG. 4(a)), the through-grooves Vx2 and Vx3 are connected to each other by the through-groove Ty2 at one ends (left ends in FIG. 4(a)), the through-grooves Vx3 and Vx4 are connected to each other by the through-groove Ty3 at the other ends (right ends in FIG. 4(a)), the through-grooves Vx4 and Vx5 are connected to each other by the through-groove Ty4 at one ends (left ends in FIG. 4(a)), and the through-grooves Vx5 and Vx6 are connected to each other by the through-groove Ty5 at the other ends (right ends in FIG. 4(a)). The width of each of the through-grooves is set slightly larger than the diameter of the water jet 168 injected from the above injection nozzle 16. Further, a first cutting start hole 34-1 corresponding to the first cutting start hole 26 formed in the above CSP substrate 20 is formed in the first support member 30-1 at one end (left end in FIG. 4(a)) of the through-groove Vx1 and a first cutting end hole 35-1 is formed at one end (left end in FIG. 4(a)) of the through-groove Vx6.

Second continuous through-grooves 32-2 consisting of through-grooves Vy1 to Vy5 corresponding to the cutting lines Ly1 to Ly5 of the second group formed on the above CSP substrate 20 shown in FIG. 4(b) and through-grooves Tx1 to Tx4 for connecting adjacent through-grooves Vy1 to Vy5 alternately at both ends of the through-grooves Vy1 to Vy5 are formed in the second support member 30-2. Describing the second through-grooves 32-2 in more detail, the through-grooves Vy1 and Vy2 are connected to each other by the through-groove Tx1 at the other ends (upper ends in FIG. 4(b)), the through-grooves Vy2 and Vy3 are connected to each other by the through-groove Tx2 at one ends (lower ends in FIG. 4(b)), the through-grooves Vy3 and Vy4 are connected to each other by the through-groove Tx3 at the other ends (upper ends in FIG. 4(b)), and the through-grooves Vy4 and Vy5 are connected to each other by the through-groove Tx4 at one ends (lower ends in FIG. 4(b)). The width of each of the through-grooves is set slightly larger than the diameter of the water jet 168 injected from the above injection nozzle 16. Further, a second cutting start hole 34-2 corresponding to the second cutting start hole 28 formed in the above CSP substrate 20 is formed at a left portion slightly away from one end (lower end in FIG. 4(b)) of the through-groove Vy1 in the second support member 30-2 and a second cutting end hole 35-2 is formed at a right portion slightly away from the other end (upper end in FIG. 4(b)) of the through-groove Vy5. The second cutting start hole 34-2 is connected to one end (lower end in FIG. 4(b)) of the through-groove Vy1 by a through-groove Tx6 and the second cutting end hole 35-2 is connected to the other end (upper end in FIG. 4(b)) of the through-groove Vy5 by a through-groove Tx7.

A description will be subsequently given of a constitution for setting the support member 30 and the CSP substrate 20 on the above holding table 18 with reference to FIGS. 5(a) and 5(b).

Two positioning pins 185 and 185 are provided on the top of the holding table 18 and a cover 184 having positioning holes 186 and 186 to be fitted to the positioning pins 185 and 185 is detachably placed on the top of the holding table 18. Further, pair of support bases 188 and 188, which are opposed to each other and project toward the opening 182 side, are mounted on the undersurface of the holding table 18.

To set the substrate 20 on the holding table 18, the support member 30 is first inserted into the opening 182 from above and placed on the support bases 188 and 188. The CSP substrate 20 is fitted in the opening 182 with the package portion 24 side facing down, and the positioning holes 29 and 29 formed in the metal frame 22 are fitted to the above positioning pins 185 and 185. By fitting the positioning holes 186 and 186 formed in the cover 184 to the positioning pins 185 and 185, the top side of the metal frame 22 of the CSP substrate 20 is covered with the cover 184.

A description will be subsequently given of an embodiment of a constitution for supporting the CSP substrate 20 on the top of the support member 30 with reference to FIGS. 5(a) and 5(b). The support member 30 shown in FIGS. 5(a) and 5(b) is applicable to at least the second support member 30-2, desirably to a combination of the second support member 30-2 and the first support member 30-1.

The support member 30 shown in FIGS. 5(a) and 5(b) comprises a suction means 35 for suction-holding the chip size package (CSP) C areas of the above CSP substrate 20. This suction means 35 has a plurality of suction holes 36 which are open to the top of the support member 30, a suction passage 37 which is formed in the support member 30 and communicates with the plurality of suction ports 36, and suction pipes 38 and 38 for connecting the suction passage 37 to a suction source that is not shown. The above plural suction holes 36 are open at positions corresponding to the chip size package (CSP) C areas of the CSP substrate 20. Therefore, the support member 30 suction-holds the chip size package (CSP) C areas of the above substrate 20 by operating the suction source (not shown) to apply negative pressure to the plurality of suction holes 36. Accordingly, even when the CSP substrate 20 is cut along the cutting lines to be divided into individual chip size packages (CSP) C as described later, the chip size packages (CSP) C do not fall apart and is held on the support bases 188 and 188.

A description will be subsequently given of another embodiment of a constitution for supporting the CSP substrate 20 on the top surface of the support member 30 with reference to FIGS. 6(a) and 6(b). In the embodiment shown in FIGS. 6(a) and 6(b), the package portion 24 of the CSP substrate 20 is so constituted to be adhered to the top surface of the support member 30 by using an adhesive double coated tape 50. This adhesive double coated tape 50 generally has relatively high adhesion strength, but it has a property that its adhesion strength lowers when it is subjected to an external stimulus, for example, to be exposed to ultraviolet radiation or heated at a predetermined temperature (for example, 50 to 100° C.). Though the adhesive double coated tape 50 is easily cut along the above cutting lines when the CSP substrate 20 is cut along the cutting lines as will be described later, it can hold the separated chip size packages (CSP) C on the support member 30. In the embodiment shown in FIGS. 6(a) and 6(b), the constitution for setting the support member 30 and the CSP substrate 20 on the holding table 18 is substantially the same as in the constitution shown in FIGS. 5(a) and 5(b). Therefore, the same members are given the same reference numerals and their descriptions are omitted.

Figure 7:
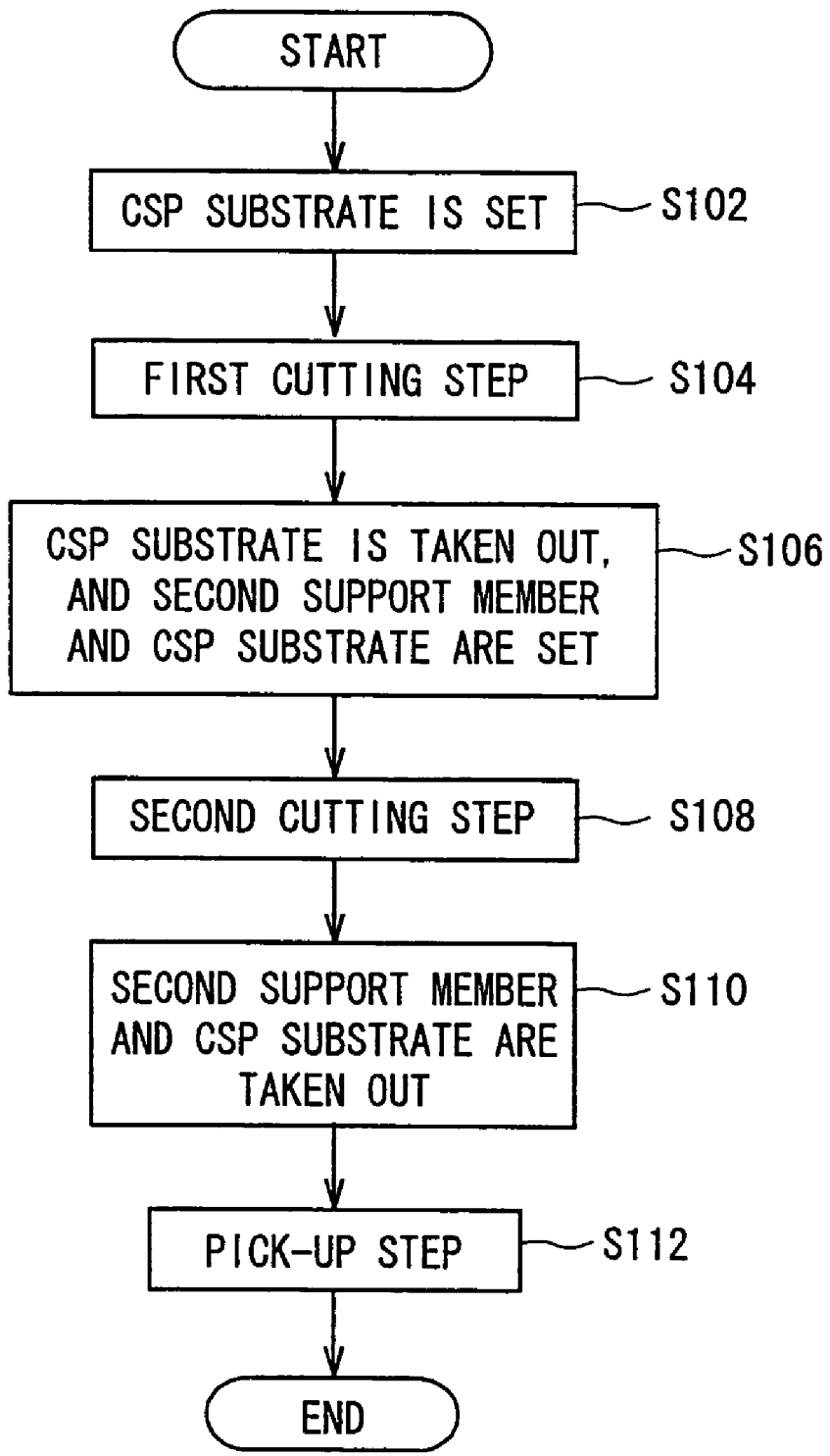
FIG. 7 is a flow chart showing the steps of the water jet processing method according to a first embodiment of the present invention.
Figure 9:
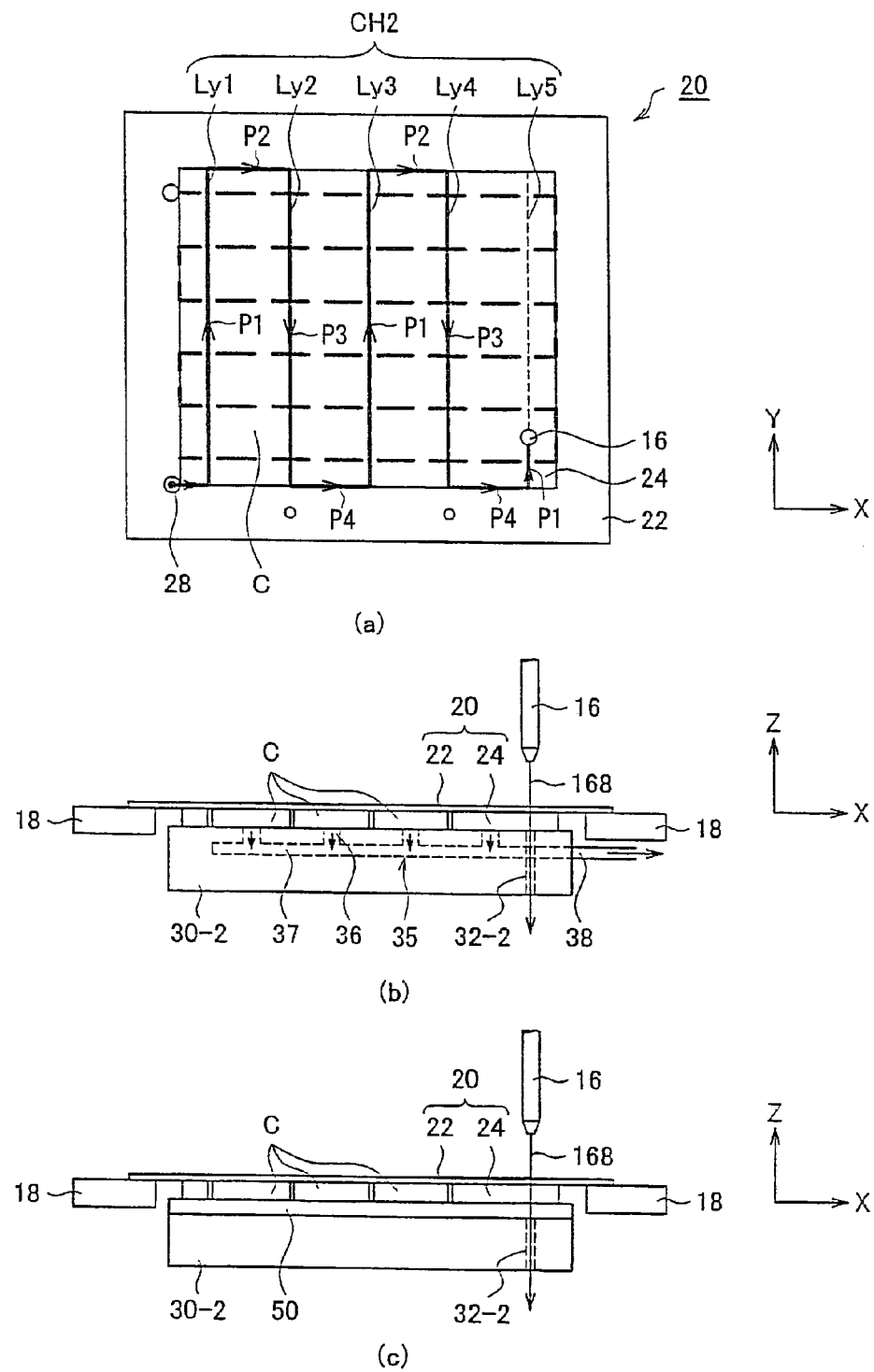
FIGS. 9(a), 9(b) and 9(c) are explanatory diagrams showing a second cutting step in the water jet processing method according to the first embodiment of the present invention.
Figure 10:
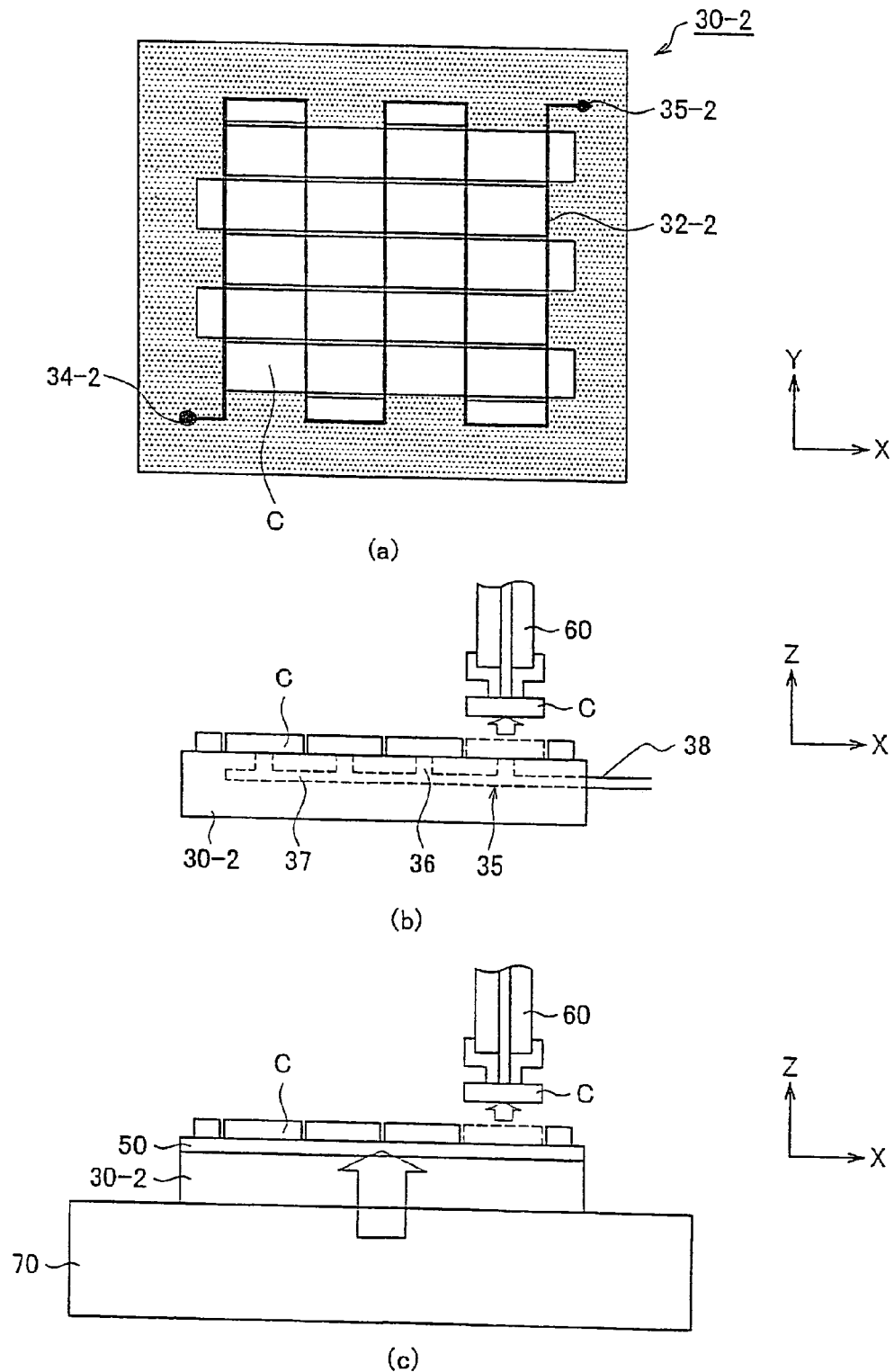
FIGS. 10(a), 10(b) and 10(c) are explanatory diagrams showing a pick-up step in the water jet processing method of the present invention.

A description will be subsequently given of the water jet processing method for cutting the CSP substrate 20 as a workpiece along the cutting lines Lx1 to Lx6 of the first group and the cutting lines Ly1 to Ly5 of the second group according to a first embodiment of the present invention by using the above-described water jet processing machine 10 with reference to FIGS. 7 to 10. FIG. 7 is a flowchart showing the steps of the processing method according to the first embodiment of the present invention. FIGS. 8(a) and 8(b) are diagrams for explaining the first cutting step, FIGS. 9(a), 9(b) and 9(c) are diagrams for explaining the second cutting step, and FIGS. 10(a), 10(b) and 10(c) are diagrams for explaining a pick-up step.

In the first embodiment shown in FIGS. 7 to 10, it is shown an example for a case where the CSP substrate 20 as a workpiece is relatively thick and is not deformed by the pressure of the water jet 168. When the CSP substrate 20 is relatively thick, it is not always necessary to support the substrate 20 by the support member 30 in the first cutting step. Therefore, in the embodiment shown in FIGS. 7 to 10, the substrate 20 is supported by the support member 30 only in the second cutting step.

In the processing method shown in FIGS. 7 to 10, as shown in FIG. 7, the CSP substrate 20 is first set on the holding table 18 as described above in the step S102. At this point, the first support member 30-1 is not set on the holding table 18.

After the CSP substrate 20 is set on the holding table 18, as shown in FIGS. 8(a) and 8(b), the first cutting step (step S104) for moving the injection nozzle 16 and the CSP substrate 20 relative to each other along the plurality of cutting lines Lx1 to Lx6 of the first group CH1 while the water jet 168 is injected from the injection nozzle 16. More specifically, the holding table 18 is first moved in the directions indicated by the arrow X and the arrow Y to bring the first cutting start hole 26 formed at one end (left end in FIG. 8(a)) of the first cutting line Lx1 of the first group formed on one side (upper side in FIG. 8(a)) of the CSP substrate 20 to a position right below the injection nozzle 16. Then, the high-pressure water generating means 12 is activated to start the injection of the water jet 168 from the injection nozzle 16. Since the water jet 168 passes through the first cutting start hole 26 at this time, it does not come into contact with the substrate 20.

Thereafter, the first step (P1) for moving the holding table 18 and the injection nozzle 16 relative to each other from one end (left end in FIG. 8(a)) to the other end (right end in FIG. 8(a)) along the first cutting line Lx1 of the first group, the second step (P2) for moving the holding table 18 and the injection nozzle 16 relative to each other from the other end (right end in FIG. 8(a)) of the first cutting line Lx1 of the first group to the other end (right end in FIG. 8(a)) of the adjacent second cutting line Lx2 of the first group, the third step (P3) for moving the holding table 18 and the injection nozzle 16 relative to each other from the other end (right end in FIG. 8(a)) to one end (left end in FIG. 8 (a)) along the second cutting line Lx2 of the first group, and the fourth step (P4) for moving the holding table 18 and the injection nozzle 16 relative to each other from one end (left end in FIG. 8(a)) of the second cutting line Lx2 to one end (left end in FIG. 8(a)) of the adjacent third cutting line Lx3 of the first group are carried out as shown in FIG. 8(a). The above first to fourth steps (P1 to P4) are subsequently repeated up to the last cutting line Lx6 of the first group formed on the other side (lower side in FIG. 8(a)). Thus, in the first cutting step, the water jet 168 is injected from the injection nozzle 16 continuously along the cutting lines Lx1 to Lx6 of the first group as indicated by the arrows in FIG. 8(a). As a result, the substrate 20 is cut along the cutting lines Lx1 to Lx6 of the first group as indicated by the arrows in FIG. 8(a). The relative moving speed of the holding table 18 and the injection nozzle 16 in the above first cutting step is set to, for example, 20 mm/sec. After the first cutting step is over as described above, the operation of the high-pressure water generating means 12 is suspended.

Since the CSP substrate 20 is cut along the plural cutting lines Lx1 to Lx6 of the first group CH1 continuously in the above first cutting step, it is not necessary to repeat the operation and suspension of the high-pressure water generating means 12 for each of the cutting lines of the first group, thereby making it possible to improve productivity.

After the first cutting step is carried out as described above, the CSP substrate 20 is taken out from the holding table 18, the second support member 30-2 is set on the holding table 18 and the CSP substrate 20 is set again (step S106) (see FIGS. 5(a) and 5(b) and FIGS. 6(a and 6(b)).

Next comes the second cutting step (step S108) for moving the injection nozzle 16 and the substrate 20 relative to each other along the plurality of cutting lines Ly1 to Ly5 of the second group CH2 formed on the CSP substrate 20 while the water jet 168 is injected from the injection nozzle 16 as shown in FIGS. 9(a), 9(b) and 9(c). More specifically, the holding table 18 is first moved in the directions indicated by the arrow X and the arrow Y to bring the second cutting start hole 28 formed on one end (left end in FIG. 9(a)) side of the first cutting line Ly1 of the second group on one side (left side in FIG. 9(a)) of the CSP substrate 20 to a position right below the injection nozzle 16. The high-pressure water generating means 12 is then activated to start the injection of the water jet 168 from the injection nozzle 16.

Thereafter, the holding table 18 and the injection nozzle 16 are moved relative to each other from the second cutting start hole 28 to one end (lower end in FIG. 9(a)) of the first cutting line Ly1 of the second group, as shown in FIG. 9(a). The first step (P1) for moving the holding table 18 and the injection nozzle 16 relative to each other from one end (lower end in FIG. 9(a)) of the second group to the other end (upper end in FIG. 9(a)) along the first cutting line Ly1 of the second group, the second step (P2) for moving the holding table 18 and the injection nozzle 16 relative to each other from the other end (upper end in FIG. 9(a)) of the first cutting line Ly1 of the second group to the other end (upper end in FIG. 9(a)) of the adjacent second cutting line Ly2 of the second group, the third step (P3) for moving the holding table 18 and the injection nozzle 16 relative to each other from the other end (upper end in FIG. 9(a)) to one end (lower end in FIG. 9(a)) along the second cutting line Ly2 of the second group, and the fourth step (P4) for moving the holding table 18 and the injection nozzle 16 relative to each other from one end (lower end in FIG. 9(a)) of the second cutting line Ly2 of the second group to one end (lower end in FIG. 9(a)) of the adjacent third cutting line Ly3 of the second group are carried out. The above first to fourth steps (P1 to P4) are subsequently repeated up to the last cutting line Ly5 of the second group formed on the other side (right side in FIG. 9(a)). In the second cutting step, the water jet 168 is injected from the injection nozzle 16 continuously along the cutting lines Ly1 to Ly5 of the second group as indicated by the arrows in FIG. 9(a). As a result, the CSP substrate 20 is cut along the cutting lines Ly1 to Ly5 of the second group as indicated by the arrows in FIG. 9(a). After the second cutting step as described above, the operation of the high-pressure water generating means 12 is suspended.

In the above second cutting step, the water jet 168 that is injected from the injection nozzle 16 is relatively moved along the second through-groove 32-2 formed in the second member 30-2 for supporting the CSP substrate 20. Therefore, as shown in FIGS. 9(b) and 9(c), the water jet 168 by which the CSP substrate 20 has been cut, passes through the second through-groove 32-2 (see FIG. 4(b)) formed in the second support member 30-2 and flows down. Consequently, it is possible to prevent the CSP substrate 20 from being raised by the splashed water jet 168 which hits the second support member 30-2. Further, since the CSP substrate 20 is supported by the second support member 30-2 in the second cutting step, it is not deformed by the pressure of the water jet 168 and hence, can be cut with high accuracy. Further, since the CSP substrate 20 is cut continuously along the plurality of cutting lines Ly1 to Ly5 of the second group CH2 in the second cutting step, like in the first cutting step, it is not necessary to repeat the operation and suspension of the high-pressure water generating means 12 for each cutting line of the second group, thereby making it possible to improve productivity.

By carrying out the above first cutting step and second cutting step, the CSP substrate 20 is cut along the plural cutting lines Lx1 to Lx6 of the first group and the plural cutting lines Ly1 to Ly5 of the second group to be divided into individual chip size packages (CSP) C. The individual chip size packages (CSP) C are suction-held on the second support member 30-2 by the suction means 35 as shown in FIG. 9(b) or by the adhesive tape 50 as shown in FIG. 9(c). Therefore, they do not fall off.

After the first cutting step and the second cutting step are carried out as described above, the second support member 30-2 holding the individually divided chip size packages (CSP) C as described above is taken out from the holding table 18 (step S110). Therefore, the separated individual chip size packages (CSP) C are held on the second support member 30-2, as shown in FIG. 10(a). Consequently, the individually divided chip size packages (CSP) C can be carried to the subsequent pick-up step in a state of being held on the second support member 30-2.

A description will be subsequently given of the pick-up step (step S112) for picking up the plurality of chip size packages (CSP) C held on the second support member 30-2 with reference to FIGS. 10(b) and 10(c).

When the second support member 30-2 having a suction means 35 is used as shown in FIG. 10(b), the suction of the chip size packages (CSP) C by the suction means 35 is canceled. A pick-up means 60 is then activated to pick up the chip size packages (CSP) C.

When the second support member 30-2 having the adhesive tape 50 affixed thereto is used as shown in FIG. 10(c), the second support member 30-2 holding the plurality of chip size packages (CSP) C is placed on, for example, a heating means 70 to heat the adhesive tape 50. As a result, the adhesion strength of the adhesive tape 50 is reduced to enable the chip size packages (CSP) C to be easily peeled off from the adhesive tape 50. Thereafter, the pick-up means 60 is activated to pick up the semiconductor chips C.

Figure 11:
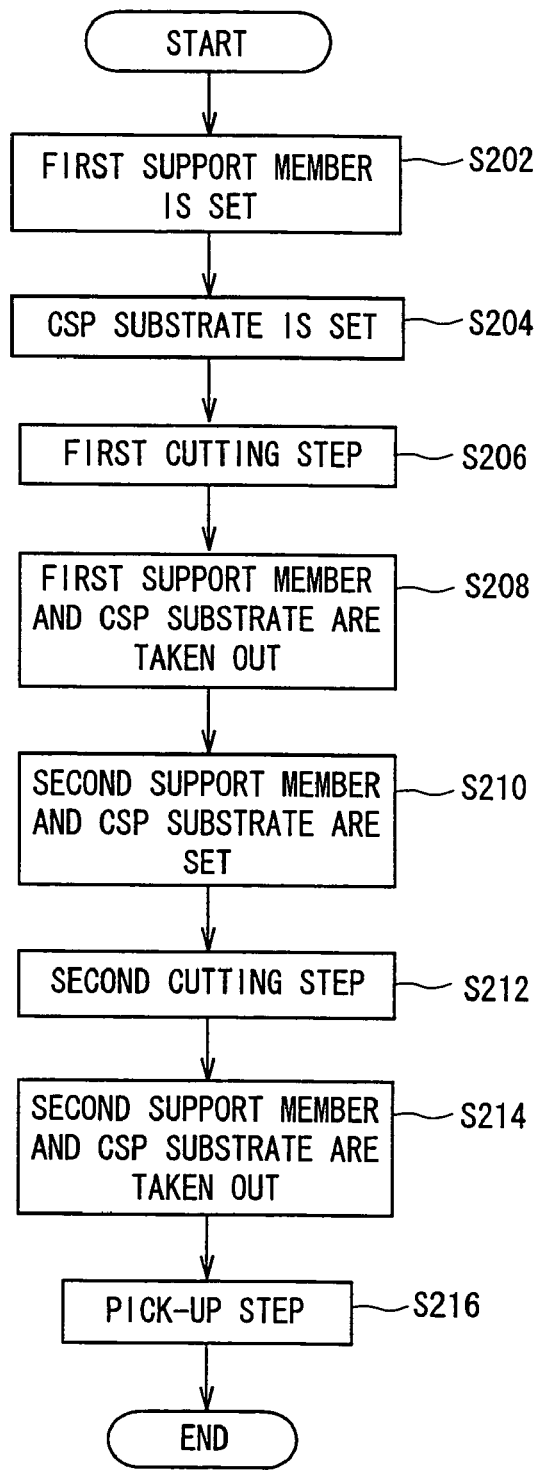
FIG. 11 is a flow chart showing the steps of the water jet processing method according to a second embodiment of the present invention.
Figure 12:
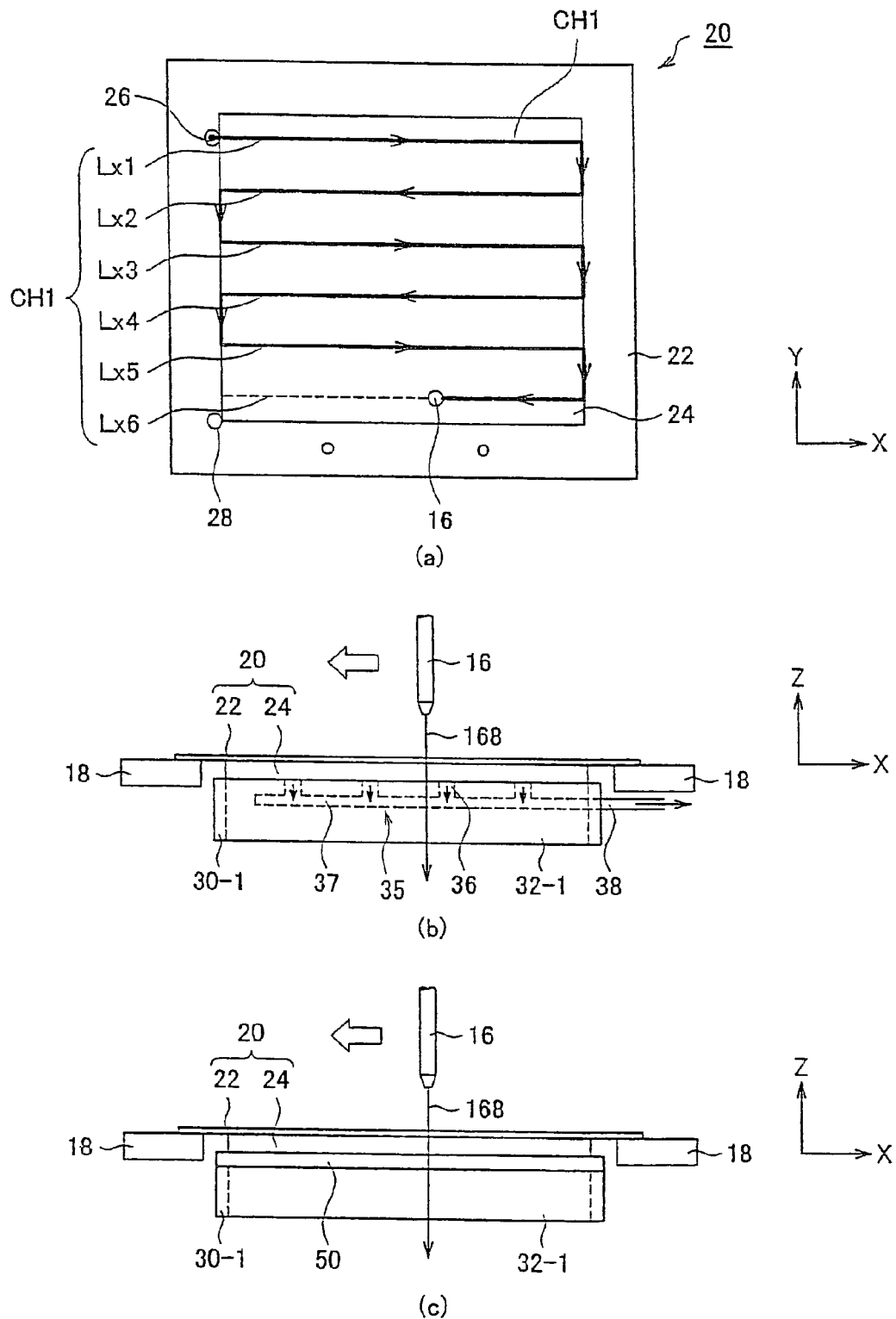
FIGS. 12(a), 12(b) and 12(c) are explanatory diagrams showing a first cutting step in the water jet processing method according to the second embodiment of the present invention.

A description will be subsequently given of the method of cutting the CSP substrate 20 as a workpiece along the cutting lines Lx1 to Lx6 of the first group and the cutting lines Ly1 to Ly5 of the second group by using the above water jet processing machine 10 according to a second embodiment of the present invention with reference to FIG. 11 and FIGS. 12(a), 12(b) and 12(c). FIG. 11 is a flow chart showing the steps of the processing method according to the second embodiment, and FIGS. 12(a), 12(b) and 12(c) are diagrams explaining the first cutting step.

The processing method based on the flow chart of FIG. 11 is applicable to a case where the CSP substrate 20 as a workpiece is thin in thickness and is deformed due to the pressure of the water jet 168.

In the step 202 of the processing method based on the flow chart shown in FIG. 11, the first support member 30-1 is first set on the holding table 18. The substrate 20 is then set on the holding table 18 (step S204) (see FIGS. 5(a) and 5(b) and FIGS. 6(a) and 6(b)). As a result, the substrate 20 is held on the first support member 30-1.

Next comes the first cutting step for moving the injection nozzle 16 and the substrate 20 relative to each other along the plurality of cutting lines Lx1 to Lx6 of the first group CH1 formed on the CSP substrate 20 (step S206) This first cutting step is substantially identical to the first cutting step (see FIGS. 8(a) and 8(b)) in step S104 of the first embodiment except that the first support member 30-1 is used, and therefore, its description will be omitted. In this first cutting step, the water jet 168 injected from the injection nozzle 16 is relatively moved along the first through-groove 32-1 (see FIG. 4(a)) formed in the first support member 30-1 for supporting the CSP substrate 20. Therefore, the water jet 168 by which the CSP substrate 20 has been cut, passes through the first through-groove 32-1 formed in the first support member 30-1 and flows down. Consequently, it is possible to prevent the CSP substrate 20 from being raised by the splashed water jet 168 which hits the first support member 30-1.

After the first cutting step, the CSP substrate 20 and the first support member 30-1 are taken out from the holding table 18 (step S208), the second support member 30-2 is set on the holding table 18 and the CSP substrate 20 is set again (step S210) (see FIGS. 5(a) and 5(b) and FIGS. 6(a) and 6(b)).

Next comes the second cutting step for moving the injection nozzle 16 and the substrate 20 relative to each other along the plurality of cutting lines Ly1 to Ly5 of the second group CH2 while the water jet 168 is injected from the injection nozzle 16 (step S212). Since the second cutting step in this step S212 is identical to the second cutting step (see FIG. 9) in the step S108 of the first embodiment, its description will be omitted.

By carrying out the above first cutting step and the second cutting step, the CSP substrate 20 is cut along the plurality of cutting lines Lx1 to Lx6 of the first group and the plurality of cutting lines Ly1 to Ly5 of the second group to be divided into individual chip size packages (CSP) C.

After the first cutting step and the second cutting step are carried out as described above, the second support member 30-2 holding the individually divided chip size packages (CSP) C is taken out from the holding table 18 (step S214), and the pick-up step (step S216) is carried out. Since the step S214 and the step S216 are identical to the step S110 and step S112 of the above-described first embodiment, respectively, their descriptions are omitted.

The individually divided chip size packages (CSP) C are held on the second support member 30-2 taken out in the above step S214, as shown in FIG. 10(a). Therefore, the individually divided chip size packages (CSP) C can be carried to the subsequent pick-up step in a state where they are held on the second support member 30-2.

A description will be subsequently given of the processing method for cutting the CSP substrate 20 as a workpiece along the cutting lines Lx1 to Lx6 of the first group and the cutting lines Ly1 to Ly5 of the second group according to a third embodiment of the present invention by using the above-described water jet processing machine 10.

Figure 13:
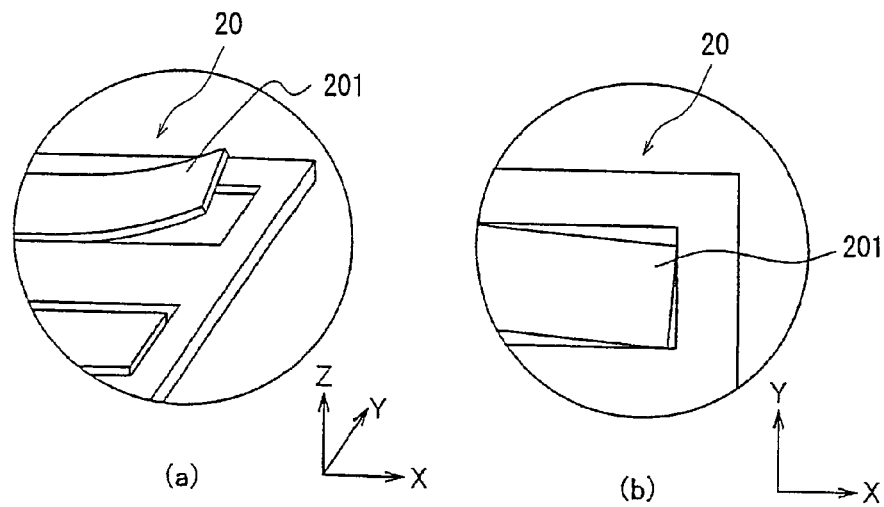
FIGS. 13(a) and 13(b) are explanatory views, in an enlarged manner, of the cut portions of the workpiece which has undergone the first cutting step.

When the first cutting step is carried out as shown in FIGS. 8(a) and 8(b), the substrate 20 as a workpiece is cut into rectangular pieces 201 of which a cut piece is supported by only one side out of the four sides. Therefore, a cut piece 201 may warp in the vertical direction as shown in FIG. 13(a) or may cause lateral slip in the horizontal direction as shown in FIG. 13(b) due to the difference in physical properties between the metal frame and the package portion molded by a resin especially in the CSP substrate 20 as a packaged workpiece.

When the cut piece 201 of the CSP substrate 20 as a workpiece warps in the vertical direction or causes lateral slip in the horizontal direction, it gives a hindrance to the above second cutting step. That is, the interval between the injection nozzle for injecting a water jet and the workpiece is preferred to be as small as possible, and is set to 50 m to 1 mm, for example. Therefore, when the cut piece 201 of the CSP substrate 20 as a workpiece warps, it interferes with the injection nozzle, whereby it may be impossible to carry out the second cutting step.

In the water jet processing method according to the third embodiment of the present invention, when the CSP substrate 20 as a workpiece and the water jet are moved relative to each other from one end or the other end of a cutting line to an adjacent cutting line in the first cutting step for cutting the CSP substrate 20 along the cutting lines Lx1 to Lx6 of the first group, the above relative moving speed is suitably set to ensure that the water jet does not cut through the CSP substrate 20, in order to solve the above defect.

Figure 14:
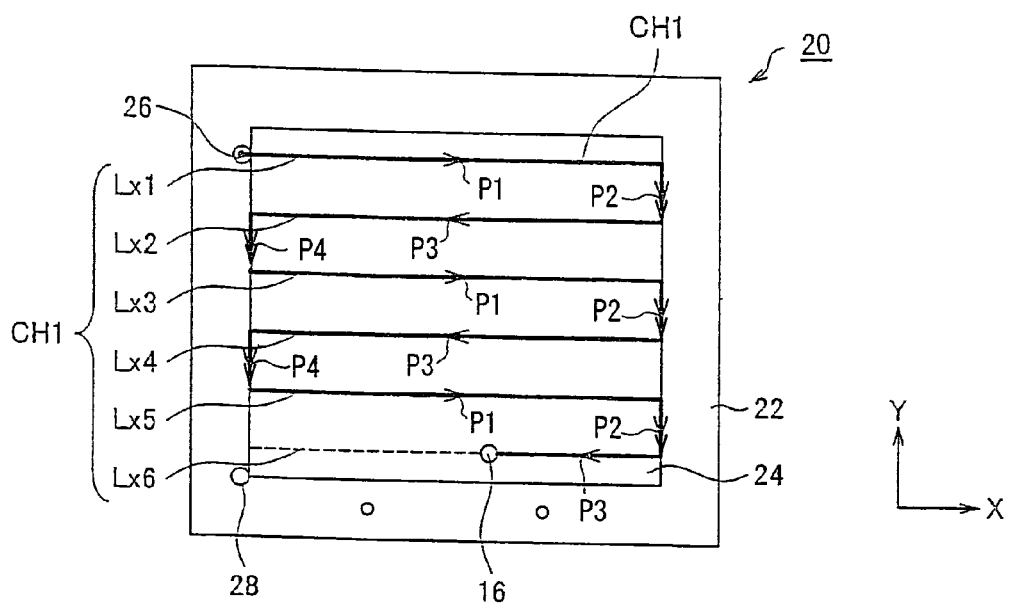
FIG. 14 is a diagram showing a first cutting step in the water jet processing method according to a third embodiment of the present invention.

The water jet processing method according to the third embodiment of the present invention will be described hereinunder with reference to FIG. 14. FIG. 14 corresponds to FIG. 8(a).

In the first cutting step of the third embodiment, the relative moving speed of the injection nozzle 16 for injecting a water jet 168 and the CSP substrate 20 in the first step (P1) and the third step (P3) for cutting the CSP substrate 20 along the cutting lines Lx1 to Lx6 of the first group formed on the CSP substrate 20 is set to, for example, 20 mm/sec, like in the first embodiment and the second embodiment. Therefore, the CSP substrate 20 is cut along the cutting lines Lx1 to Lx6 of the first group.

Meanwhile, in the second step (P2) for cutting the CSP substrate 20 between neighboring cutting lines at the other ends (right ends in FIG. 14) of the cutting lines Lx1 to Lx6 of the first group and the fourth step (P4) for cutting the CSP substrate 20 between neighboring cutting lines at one ends (left ends in FIG. 14), the relative moving speed of the injection nozzle 16 for injecting the water jet 168 and the CSP substrate 20 is set to, for example, 200 mm/sec which is faster than that in the above first step (P1) and the third step (P3). Therefore, in the second step (P2) and the fourth step (P4), the time that the water jet 168 has acted on the CSP substrate 20 is short, so that the CSP substrate 20 is not cut completely. As a result, the CSP substrate 20 which has undergone the first cutting step is cut along the cutting lines Lx1 to Lx6 of the first group but the cut pieces 201 as shown in FIGS. 13(a) and 13(b) are not formed. To carry out the above first cutting step, when thickness of the CSP substrate 20 is thin, the CSP substrate 20 is supported by the above first support member 30-1 and when thickness of the CSP substrate 20 is thick, it may or may not be supported by the above first support member 30-1.

After the first cutting step for cutting the CSP substrate 20 along the cutting lines Lx1 to Lx6 of the first group formed on the CSP substrate 20 is carried out as described above, the CSP substrate 20 is cut along the cutting lines Lx1 to Lx6 of the first group and the cutting lines Ly1 to Ly5 of the second group to be divided into individual chip size packages (CSP) C by carrying out the second cutting step of the first embodiment and the second embodiment. Since the cut pieces 201 as shown in FIGS. 13(a) and 13(b) are not formed in the CSP substrate 20 which has undergone the first cutting step, the second cutting step is carried out smoothly.

What is claimed is:

1. A water jet processing method for cutting a workpiece having a first group composed of first plural cutting lines extending in a predetermined direction and a second group composed of second plural cutting lines formed perpendicular to the first plural cutting lines by injecting a water jet along the first plural cutting lines and the second plural cutting lines formed on the workpiece, comprising the steps of:

a first cutting step for repeating a first step for moving the water jet and the workpiece relative to each other from one end to the other end of a first cutting line of the first cutting lines formed on one side of the first group formed on the workpiece while the water jet is injected along the first cutting line, a second step for moving the water jet and the workpiece relative to each other from the other end of the first cutting line of the first cutting lines to the other end of a second cutting line adjacent to the first cutting line of the first cutting lines, a third step for moving the water jet and the workpiece relative to each other along the second cutting line of the first cutting lines, and a fourth step for moving the water jet and the workpiece relative to each other from one end of the second cutting line of the first cutting lines to one end of a third cutting line adjacent to the second cutting line of the first cutting lines, up to the last cutting line of the first cutting lines formed on the other side of the first group formed on the workpiece; and a second cutting step for repeating a first step for moving the water jet and the workpiece relative to each other from one end to the other end of a first cutting line of the second cutting lines formed on one side of the second group formed on the workpiece while the workpiece which has undergone the first cutting step is supported by a support member having through-grooves corresponding to the cutting lines of the second group formed on workpiece and the water jet is injected along the first cutting line, a second step for moving the water jet and the workpiece relative to each other from the other end of the first cutting line to the other end of a second cutting line adjacent to the first cutting line of the second cutting lines, a third step for moving the water jet and the workpiece relative to each other from the other end to one end along the second cutting line of the second cutting lines, and a fourth step for moving the water jet and the workpiece relative to each other from one end of the second cutting line to one end of a third cutting line adjacent to the second cutting line of the second cutting lines, up to the last cutting line of the second group formed on the other side of the second group.

2. The water jet processing method according to claim 1, wherein the first cutting step is carried out by supporting the workpiece with a holding member having through-grooves corresponding to the cutting lines of the first group formed on the workpiece.

3. The water jet processing method according to claim 1, wherein the support member for supporting the workpiece in the second cutting step has a plurality of suction holes which are open at positions corresponding to a plurality of areas sectioned by the plural cutting lines of the first group and the plural cutting lines of the second group of the workpiece and suction passages which communicate with the plurality of suction holes, and suction-holds the workpiece.

4. The water jet processing method according to claim 1, wherein the support member for supporting the workpiece in the second cutting step holds the workpiece by means of an adhesive tape.

5. The water jet processing method according to claim 4, wherein the adhesive tape has a property that its adhesion strength is reduced by an external stimulus.

6. The water jet processing method according to claim 1, wherein the relative moving speed of the water jet and the workpiece in the second step and the fourth step of the first cutting step is set faster than the relative moving speed of the water jet and the workpiece in the first step and the third step so that the workpiece is not cut through.

* * * * *